US006728111B1

(12) United States Patent
Ku

(10) Patent No.: US 6,728,111 B1
(45) Date of Patent: Apr. 27, 2004

(54) INTERFACE PLASTIC HOUSING ASSEMBLY

(75) Inventor: Yin-Tsair Ku, Hsin Tien (TW)

(73) Assignee: D&C Technology Co., Ltd., Hsin Tien (TW)

( * ) Notice: Subject to any disclaimer, the term of this patent is extended or adjusted under 35 U.S.C. 154(b) by 0 days.

(21) Appl. No.: 10/369,573

(22) Filed: Feb. 21, 2003

(51) Int. Cl.$^7$ .................................................. H05K 5/06

(52) U.S. Cl. ....................... 361/752; 361/797; 361/737; 361/684; 361/685; 439/79; 439/80

(58) Field of Search ................................ 361/752, 737, 361/797, 684, 685, 800, 715; 439/79, 80

(56) References Cited

U.S. PATENT DOCUMENTS 5,882,211 A * 3/1999 Choy et al. ................... 439/74
5,967,803 A * 10/1999 Ho ............................. 439/79
6,404,647 B1 * 6/2002 Minne' ...................... 361/760
6,580,615 B1 * 6/2003 Nakanishi et al. .......... 361/737

* cited by examiner

*Primary Examiner*—David Martin
*Assistant Examiner*—Hung Bui
(74) *Attorney, Agent, or Firm*—Troxell Law Office PLLC

(57) ABSTRACT

An interface plastic housing assembly for memory cards includes a plastic housing in shape of a planiform rectangular body, a plurality of terminals that are disposed in the plastic housing and have connection legs adhered to a circuit board of a memory card. The characteristics thereof are that a supporting arm is provided at the two sides of the plastic housing, respectively, and at the bottom surface of the supporting arms is provided with one or more protruding pillars, respectively. In accordance with the above structure, the protruding pillars at the two sides of the plastic housing are fitted into positioning holes disposed in advance at an apparatus or the circuit board, so as to ensure steady positioning between the circuit board and the plastic housing for surface adhesion thereof, thereby reducing the defective rate of the product.

4 Claims, 6 Drawing Sheets

INTERFACE PLASTIC HOUSING ASSEMBLY

BACKGROUND OF THE INVENTION (a) Field of the Invention

The invention relates to an interface plastic housing assembly, and more particularly, to an interface plastic housing assembly provided with a supporting arm at the two sides of the plastic housing, respectively, such that protruding pillars at the supporting arms are fitted into positioning holes disposed in advance at an apparatus or the circuit board to ensure steady positioning between the circuit board and the plastic housing for surface adhesion thereof, thereby reducing the defective rate and optimizing the competitiveness of the product.

(b) Description of the Prior Art

Referring to FIG. 5 showing a conventional schematic view of a prior interface plastic housing assembly, the plastic housing assembly is in shape of a planiform rectangular body having two rows of terminal holes transversely disposed. When each of the terminals holes a1 is fitted with a terminal b, respectively, a connection leg b1 exposed at the exterior of the plastic a from each of the terminals b is attached to a golden finger c1 at a circuit board c of a memory card. The aforesaid members are then combined between the upper and lower metal outer shells d1 and d2, and thus completing the entire assembly of the memory card. However, during the surface adhesion of the circuit board c and the connection leg b1 of the interface, although an apparatus e having recesses e1 correspondingly disposed for combining to the circuit board c and the plastic housing assembly a (as shown in FIG. 6) is provided, gaps yet exist between therein. As a result, deviations of relative positions between the plastic housing assembly a and the circuit board are liable to occur, especially position differences in translations in the up and down directions. Or, horizontal shifts may be caused by adding pressure required for adhesion, thus leading to short circuit or breakage of the contacts thereof, and further increasing the defective rate and production cost of the product.

It is observed from the above that, the positioning of terminals and a circuit board during surface adhesion for assembly is rather problematic, and therefore it is a vital task as how to provide an interface plastic housing assembly that is able to overcome the above shortcomings.

SUMMARY OF THE INVENTION

An object of the invention is to provide an innovated interface plastic housing assembly that is capable of positioning for facilitating convenient and quick surface adhesion, so as to reduce the defective rate as well as optimizing the competitiveness of the product.

In order to accomplish the above object, in accordance with the invention, a supporting arm is provided at the two sides of a plastic housing in shape of a planiform rectangular body, between the supporting arm and the plastic housing assembly is a collapsible member, and at the lower surface of the supporting arm is provided with one or more protruding pillars.

For adhering the aforesaid plastic housing assembly to the circuit on a circuit board after terminals are assembled, an apparatus having a recess corresponding to the shape of the aforesaid circuit board and plastic housing is provided. The circuit board and the plastic housing are then placed into the recess, and the protruding pillars at the two sides of the plastic housing are fitted into positioning holes disposed in advance at the circuit board. Surface adhesion of the circuit board and the terminal legs of the plastic housing assembly may then be steadily proceeded, thereby accomplishing the purposes of reducing the defective rate and optimizing the competitiveness of the product.

DETAILED DESCRIPTIONS OF THE PREFERRED EMBODIMENTS

To better understand the technical characteristics and effects of the invention, descriptions shall be given with the accompanying drawings hereunder.

Figure 1:
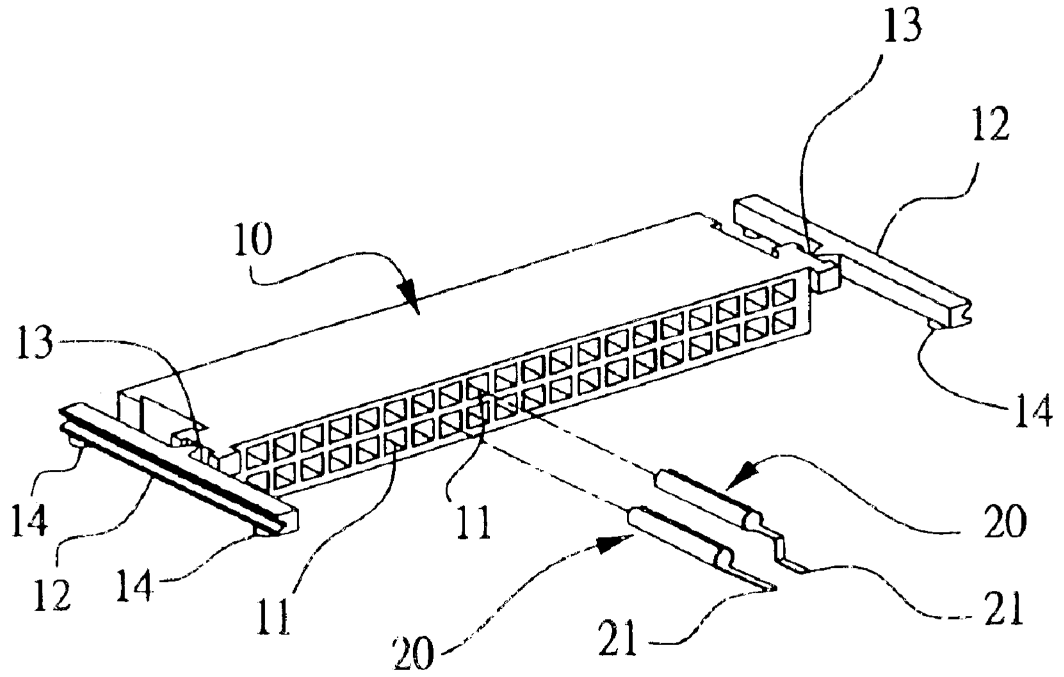
FIG. 1 shows an elevational view according to the invention.
Figure 2:
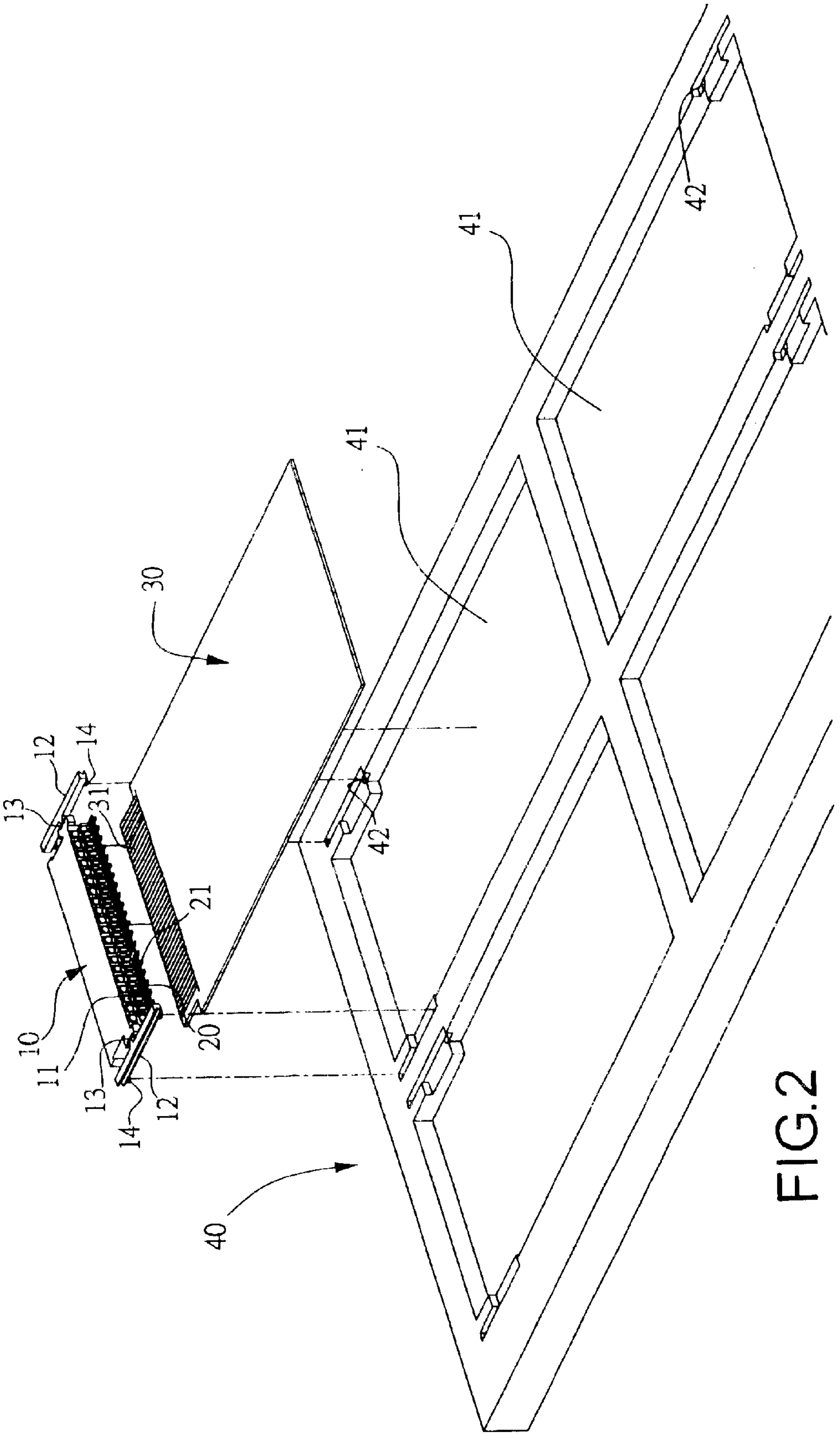
FIG. 2 shows an elevational schematic view during the assembly of an embodiment according to the invention.
Figure 3:
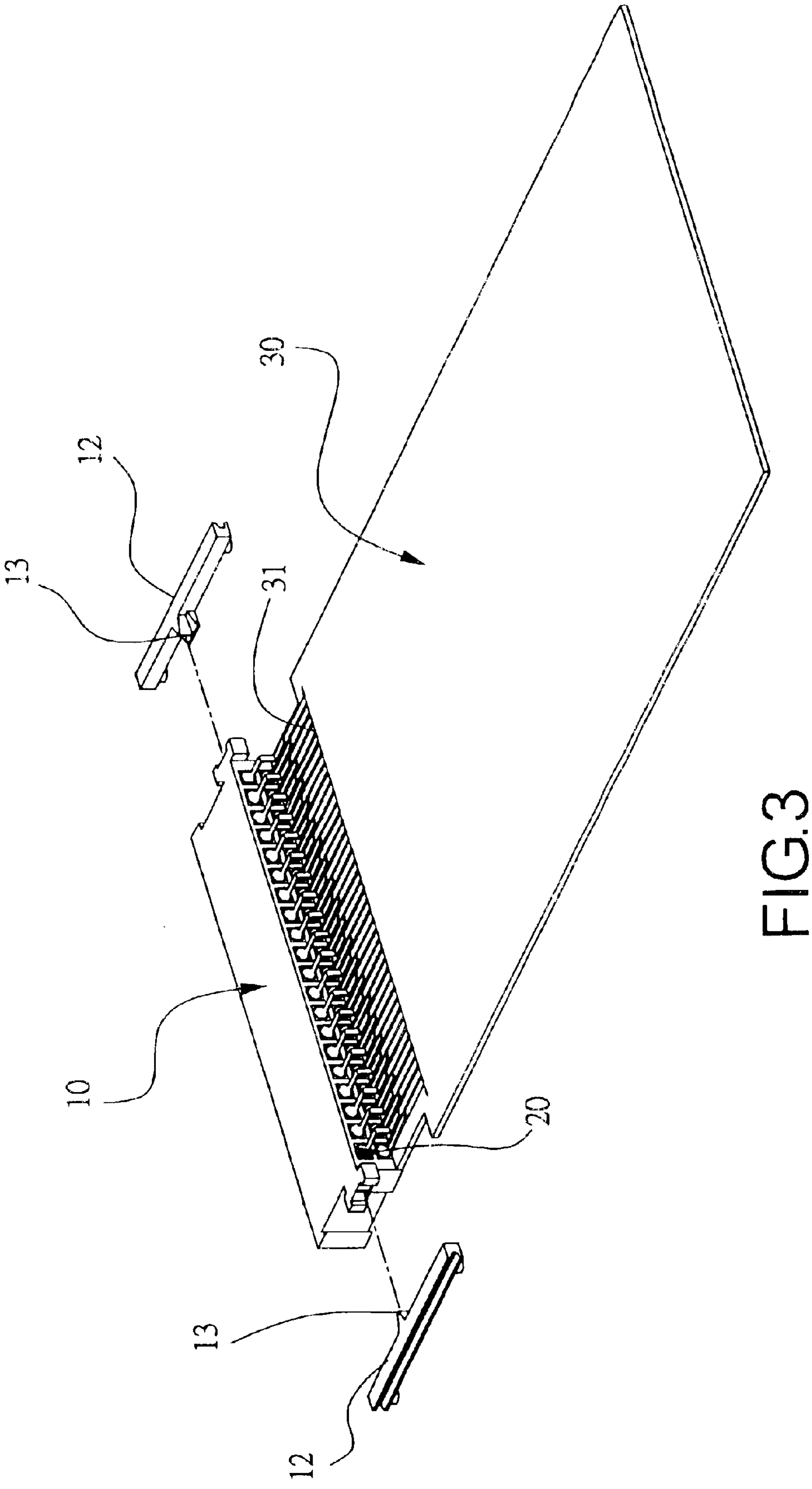
FIG. 3 shows an elevational schematic view illustrating the invention being combined to a circuit board.

Referring to FIGS. 1 to 3, the interface plastic housing assembly for memory cards in accordance with the invention comprises a plastic housing 10 in shape of a planiform rectangular body, a plurality of terminal openings 11 disposed at the plastic housing 10 for fitting terminals 20, a plurality of connection legs 21 that are exposed at the exterior of the plastic housing 10 from the rear ends of the terminals 20, and a plurality of golden fingers 31 disposed at the edge of the circuit board 30 of the memory card for adhering to the connection legs 21. The characteristics thereof are that a supporting arm 12 is extended from the two sides of the plastic housing 10, respectively, the supporting arm 12 and the plastic housing 10 are combined into one body by a collapsible member 13 provided in between, and at the two sides of the lower surface of the supporting arms 12 is provide with one or more protruding pillars 14, respectively.

In accordance with the above structure, an apparatus having at least one recess 41 is provided for surface adhesion of the plastic housing 10 having the terminal openings 11 filled with terminals. The shape of the recess 41 is designed accordingly to the combined structure of the circuit board 30 and the plastic housing 10, and has positioning holes 42 corresponding to the protruding pillars 14 at the two sides of the lower surface of the plastic housing 10.

During the assembly process of the above, the circuit board 30 and the plastic 10 are placed in sequence into the corresponding positions at the recess 41 of the apparatus, such that the protruding pillars 14 protruding downward at the two sides of the lower surface of the plastic housing 10 are fitted into the corresponding positioning holes 42 at the apparatus. Therefore, a better positioning effect between the plastic housing 10 and the circuit board 30 is obtained, and horizontal shifts are also avoided when adding pressure to the plastic housing 10 or the connection legs 21 of the terminals 20 during the surface adhesion thereof, thereby bringing convenience and stability during the construction thereof and minimizing the defective rate of the product. In addition, the collapsible members 13 at the two side supporting arms 12 connecting the plastic housing 10 are snapped after completing the surface adhesion above (as shown in FIG. 3), and assembly of metal outer covers of the product may be further proceeded.

Figure 4:
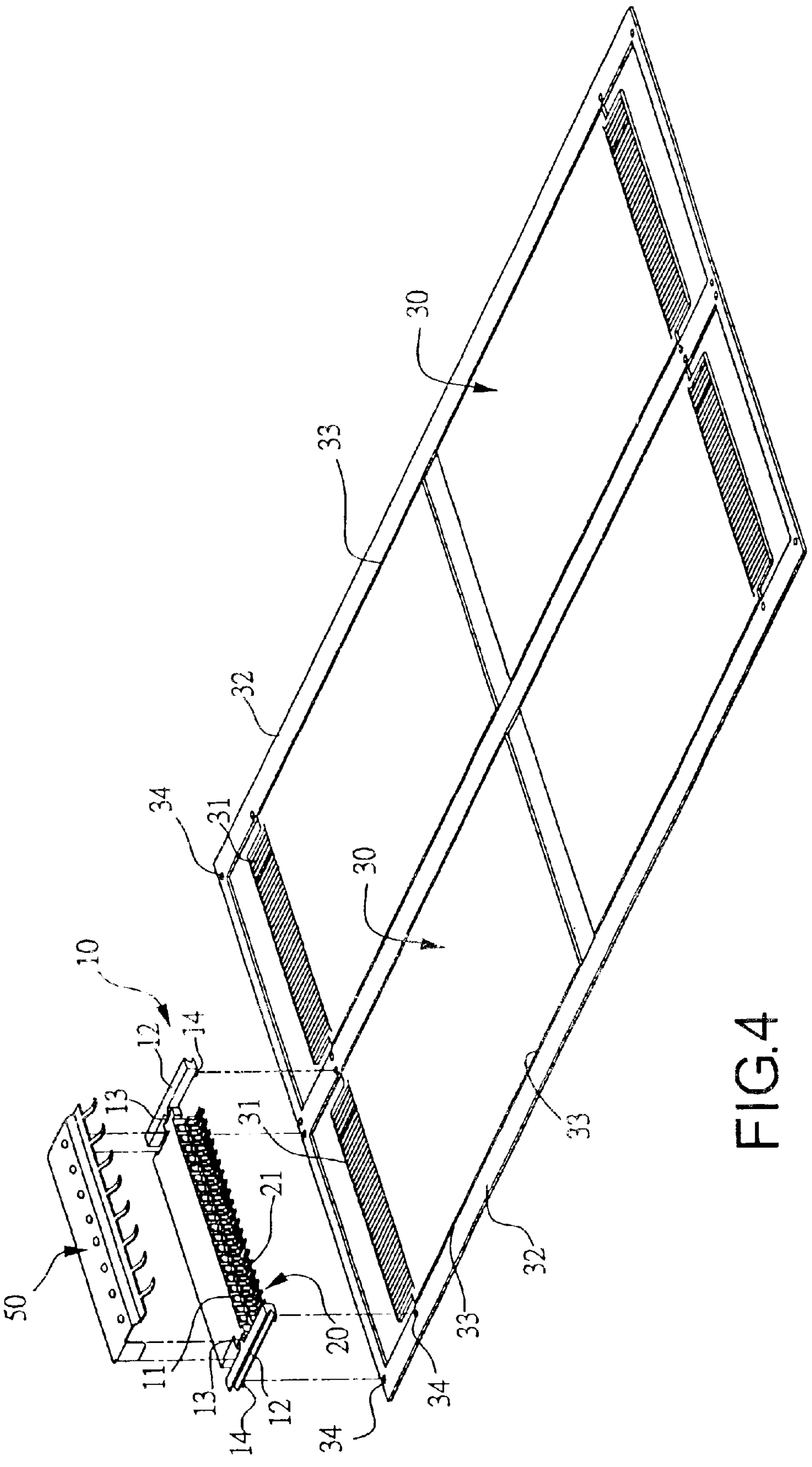
FIG. 4 shows an elevational schematic view during the assembly of another embodiment according to the invention.
Figure 5:
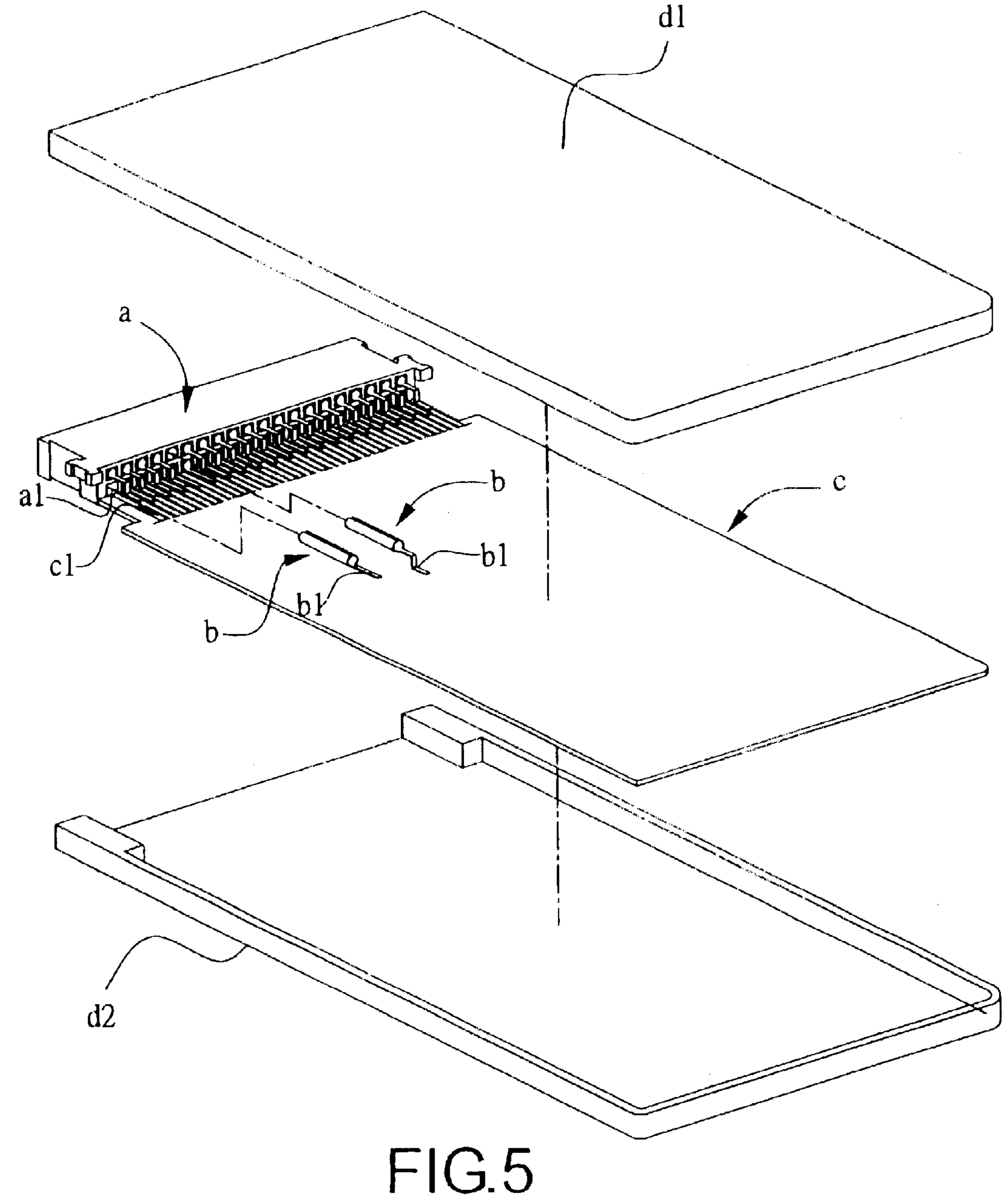
FIG.5 Prior Art
FIG. 5 shows a conventional exploded view illustrating the assembly of a prior structure.
Figure 6:
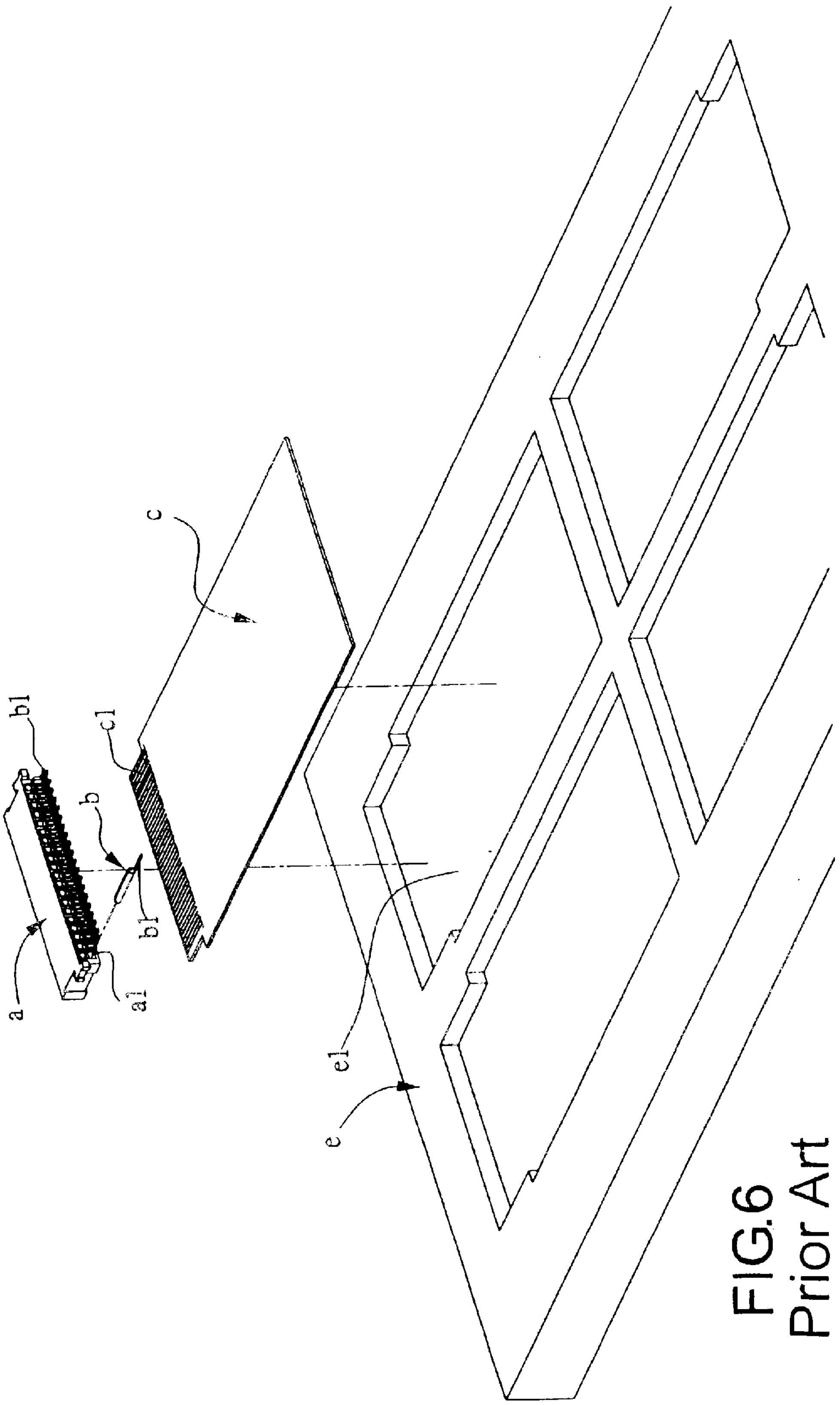
FIG.6 Prior Art
FIG. 6 shows a conventional elevational schematic of a prior memory card.

Referring to FIG. 4 showing a schematic view of another embodiment in accordance with the invention, as described above, for surface adhesion of the plastic housing 10 having the terminal openings 11 filled with terminals 20 to the circuit board 30 (in this embodiment, four circuit boards 30 are considered as one unit body, and at the upper surface of the interface plastic housing is 10 also provided with a fixed ground metal piece 50), at the periphery of the circuit boards 30 is disposed with a frame 32 connected to the circuits boards 30 by a plurality of collapsible members 33, and on one side of the frame 32 is disposed with a plurality of positioning holes 34 at positions corresponding to the protruding pillars 14 at the two sides of the lower surface of the interface plastic housing 10.

In accordance with the above structure, the protruding pillars 14 at the two sides of the bottom surface of the interface plastic housing 10 are fitted into the corresponding positioning holes 34 at the circuit board frame 32 for surface adhesion when the plastic housing 10 is filled with terminals 20. Therefore, the plastic housing 10 and the circuit boards 30 are combined into one body with better positioning effects and quick adhesion process, thereby reducing the defective rate of the product and saving the production cost of the apparatus. In addition, after completing the surface adhesion thereof, the collapsible members 13 and 33 provided at the two sides of the plastic housing 10 and at the circuit board frame 32 are snapped, so as to proceed further with the assembly of the product.

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. An interface plastic housing assembly for memory cards comprising:

a) a circuit board having a plurality of gold fingers; and b) a plastic housing having:

i) a plurality of openings;

ii) a plurality of terminals inserted into the plurality of openings, each of the plurality of terminals has a connection leg extending from the plastic housing and connected to one of the plurality of gold fingers of the circuit board; and iii) two supporting arms, each supporting arm having at least one protruding pillar extending from a bottom thereof and first collapsible members, each of the two supporting arms connected to one of two opposing ends of the plastic housing by one of the first collapsible members.

2. The interface plastic housing assembly according to claim 1, further comprising an apparatus having at least one recess and a plurality of positioning holes, the circuit board and plastic housing being inserted into the at least one recess, and the at least one protruding pillar of each of the two supporting arms is inserted into one of the plurality of positioning holes in the apparatus.

3. The interface plastic housing assembly according to claim 1, further comprising a circuit board frame having a plurality of positioning holes and a plurality of second collapsible members connecting the circuit board frame to the circuit board, and each of the at least one protruding pillar of each of the two supporting arms is inserted into one of the plurality of positioning holes in the circuit board frame.

4. The interface plastic housing assembly according to claim 1, further comprising a fixed ground metal piece connected to the plastic housing.

* * * * *